US010090375B2

(12) United States Patent
Lin et al.

(10) Patent No.: US 10,090,375 B2
(45) Date of Patent: *Oct. 2, 2018

(54) SEMICONDUCTOR STRUCTURE

(71) Applicant: MediaTek Inc., Hsin-Chu (TW)

(72) Inventors: Tzu-Hung Lin, Zhubei (TW); Cheng-Chou Hung, Hukou Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/450,411

(22) Filed: Mar. 6, 2017

(65) Prior Publication Data

US 2017/0179055 A1 Jun. 22, 2017

Related U.S. Application Data

(63) Continuation of application No. 14/284,199, filed on May 21, 2014, now Pat. No. 9,620,580.

(60) Provisional application No. 61/895,451, filed on Oct. 25, 2013.

(51) Int. Cl.

*H01L 27/01* (2006.01)
*H01L 49/02* (2006.01)
*H01L 23/00* (2006.01)
*H01L 23/66* (2006.01)

(52) U.S. Cl.

CPC .............. *H01L 28/10* (2013.01); *H01L 23/66* (2013.01); *H01L 24/03* (2013.01); *H01L 24/08* (2013.01); *H01L 24/11* (2013.01); *H01L 24/13* (2013.01); *H01L 24/45* (2013.01); *H01L 24/48* (2013.01); *H01L 2223/6677* (2013.01); *H01L 2224/02181* (2013.01); *H01L 2224/03912* (2013.01); *H01L 2224/03914* (2013.01);

(Continued)

(58) Field of Classification Search

CPC ........... H01L 28/10; H01L 2924/19104; H01L 2924/19011; H01L 2224/0401

See application file for complete search history.

(56) References Cited

U.S. PATENT DOCUMENTS 7,794,531 B2 9/2010 Abys et al.
9,620,580 B2 * 4/2017 Lin ........................ H01L 28/10

(Continued)

FOREIGN PATENT DOCUMENTS

CN 101079406 A 11/2007
CN 101192542 A 6/2008

(Continued)

*Primary Examiner* — Fei Fei Yeung Lopez

(74) *Attorney, Agent, or Firm* — McClure, Qualey & Rodack, LLP

(57) ABSTRACT

The invention provides a semiconductor structure. The semiconductor structure includes a substrate. A first passivation layer is disposed on the substrate. A conductive pad is disposed on the first passivation layer. A second passivation layer is disposed on the first passivation layer. A conductive structure is disposed on the conductive pad, and a passive device is also disposed on the conductive pad, wherein the passive device has a first portion located above the second passivation layer and a second portion passing through the second passivation layer. A solderability preservative film covers the first portion of the passive device, and an under bump metallurgy (UBM) layer covers the second portion of the passive device and a portion of the conductive structure.

16 Claims, 8 Drawing Sheets

(52) U.S. Cl.
CPC ................. *H01L 2224/0401* (2013.01); *H01L 2224/08123* (2013.01); *H01L 2224/08265* (2013.01); *H01L 2224/11019* (2013.01); *H01L 2224/13022* (2013.01); *H01L 2224/13083* (2013.01); *H01L 2224/4502* (2013.01); *H01L 2224/48463* (2013.01); *H01L 2224/85007* (2013.01); *H01L 2924/19011* (2013.01); *H01L 2924/19042* (2013.01); *H01L 2924/19051* (2013.01); *H01L 2924/19103* (2013.01); *H01L 2924/19104* (2013.01)

(56) References Cited

U.S. PATENT DOCUMENTS

2009/0174071 A1 7/2009 Chao et al.
2009/0236756 A1 9/2009 Kim
2011/0101527 A1* 5/2011 Cheng .................... H01L 24/11 257/738
2011/0278736 A1 11/2011 Lin et al.
2012/0007231 A1 1/2012 Chang
2012/0326297 A1 12/2012 Choi
2014/0061888 A1* 3/2014 Lin .................... H01L 23/3128 257/690
2015/0332983 A1 11/2015 Honda
2016/0056105 A1 2/2016 Chan et al.

FOREIGN PATENT DOCUMENTS

CN 101582386 A 11/2009
CN 102378493 A 3/2012
CN 103035608 A 4/2013
CN 103219306 A 7/2013
TW 201230282 7/2012
TW 201324713 6/2013

* cited by examiner

SEMICONDUCTOR STRUCTURE

CROSS REFERENCE TO RELATED APPLICATIONS

This application is a Continuation of pending U.S. application Ser. No. 14/284,199, filed on May 21, 2014, which claims the benefit of U.S. Provisional Application No. 61/895,451 filed Oct. 25, 2013, the entirety of which is incorporated by reference herein.

BACKGROUND OF THE INVENTION

Field of the Invention

The present invention relates to a semiconductor structure, and in particular relates to a protection layer for a passive device of a semiconductor structure.

Description of the Related Art

For a conventional flip chip package, one criterion of inductors is low resistance, so that a high quality factor (Q factor) can be achieved. The quality factor (Q factor) of an inductor is the ratio of its inductive reactance to its resistance at a given frequency, and is a measure of its efficiency. The higher the Q factor of the inductor, the closer it approaches the behavior of an ideal, lossless inductor.

The conventional package fabrication process usually uses nickel (Ni)/gold (Au) layers as protection layers for the inductor. The Ni/Au protection layer can prevent the inductor from oxidation. However, the Ni/Au protection layer will cause the skin effect in the inductor. Also, the Ni/Au protection layer usually has a thick thickness. The thick Ni/Au protection layer on a surface of the inductor will degrade the Q factor and resistance of the inductor.

Thus, a novel inductor with an increased Q factor is desirable.

BRIEF SUMMARY OF THE INVENTION

A semiconductor structure is provided. An exemplary embodiment of a semiconductor structure includes a substrate. A first passivation layer is disposed on the substrate. A conductive pad is disposed on the first passivation layer. A second passivation layer is disposed on the first passivation layer. A conductive structure is disposed on the conductive pad, and a passive device is also disposed on the conductive pad, wherein the passive device has a first portion located above the second passivation layer and a second portion passing through the second passivation layer. A solderability preservative film covers the first portion of the passive device, and an under bump metallurgy (UBM) layer covers the second portion of the passive device and a portion of the conductive structure.

Another exemplary embodiment of a semiconductor structure includes a substrate. A first passivation layer is disposed on the substrate, and a conductive pad disposed on the first passivation layer. A second passivation layer is disposed on the first passivation layer. A passive device is disposed on the conductive pad, the passive device having a first portion located above the second passivation layer and a second portion passing through the second passivation layer. A solderability preservative film covers the first portion of the passive device, and an under bump metallurgy (UBM) layer covers the second portion of the passive device and a portion of the conductive structure, wherein the UBM layer and the solderability preservative film wrap the passive device, wherein the under bump metallurgy layer does not contact the second passivation layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
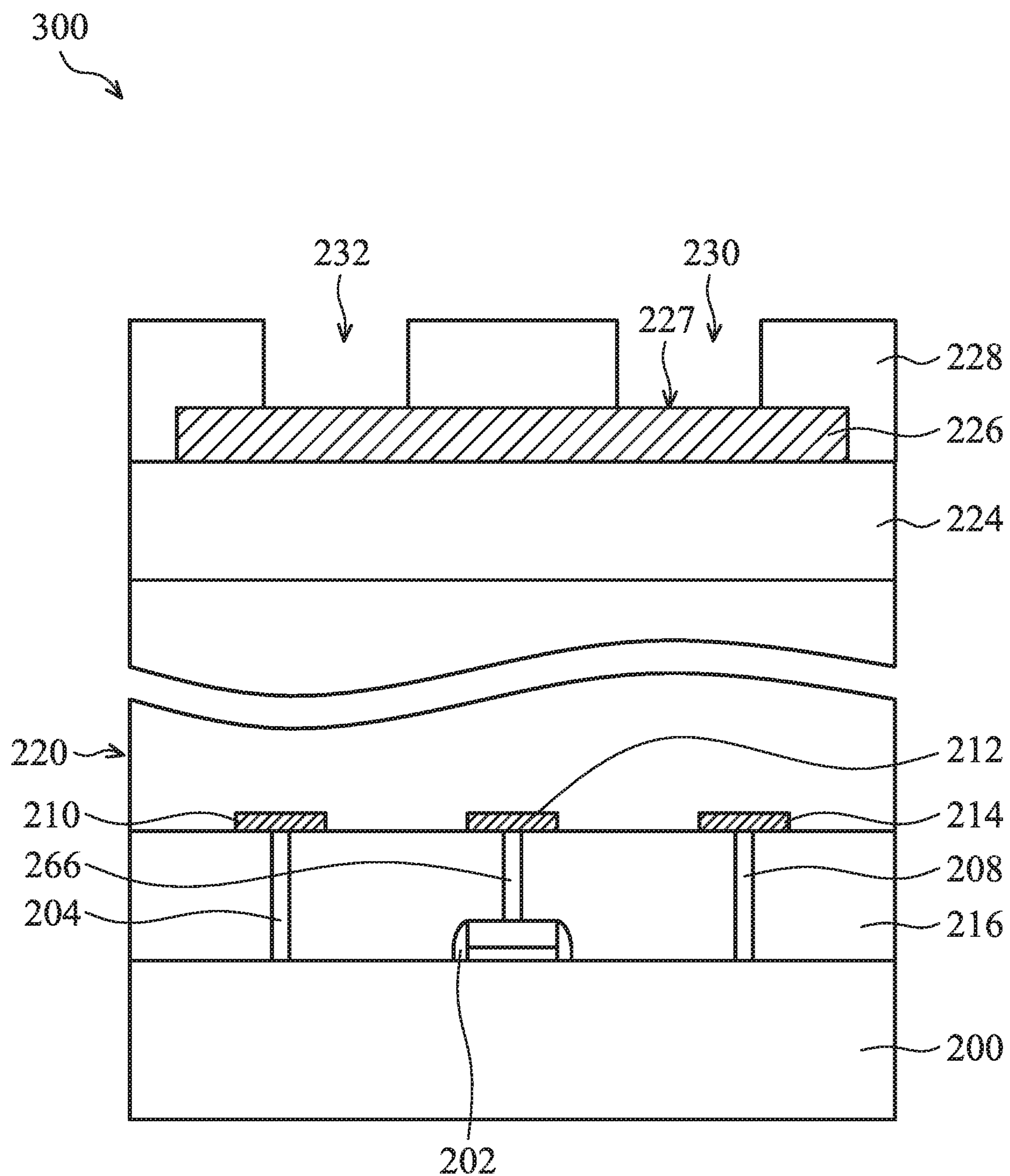
FIGS. 1-5 are cross-sectional views for fabricating one exemplary embodiment of a semiconductor structure of the invention.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions in the practice of the invention.

FIGS. 1-5 are cross-sectional views for fabricating one exemplary embodiment of a semiconductor structure **500*a* of the invention. One exemplary embodiment of a semiconductor structure 500*a* includes a wire bonding package. One exemplary embodiment of a semiconductor structure 500*a*** comprises a passive device integrated over the conductive pad by an integrated passive device (IPD) process, so that the passive device may have a much greater thickness than that of a conventional passive device disposed in the interconnection structure without additional metal layers. Also, the passive device is protected by an organic solderability preservative (OSP) film. The OSP film is formed by a nickel (Ni)-free process. If the passive device is an inductor or balun device, the OSP film can prevent from the skin effect from occurring during the operation of the passive device. The passive device, for example, an inductor or balun device, covered by the OSP film has reduced resistance and a high quality factor (Q factor).

Please refer to FIG. 1, a semiconductor chip 300 is provided in accordance with some embodiments. In some embodiments, the semiconductor chip 300 includes a substrate 200 with a semiconductor device 202 disposed thereon. An interconnection structure 220 is formed on the substrate 200, covering the semiconductor device 202. In some embodiments, the interconnection structure 220 provides electrical transmitting paths for the semiconductor device 202. In some embodiments, the interconnection structure 220 may comprise a plurality of metal layers, a plurality of dielectric layers alternatively laminated with the metal layers and a plurality of vias formed through the dielectric layers on the substrate 200. For example, the metal layers of the interconnection structure 220 may comprise the metal layers 210, 212 and 214 and a conductive pad 226.

Also, the conductive pad 226 belongs to the uppermost metal layer of the metal layers of the interconnection structure 220. In some embodiments, the conductive pad is used to transmit input/output (I/O), ground or power signals of the semiconductor chip 300, or used to transmit power signals to a subsequent passive device formed thereon. In this embodiment, the conductive pad 226 is used to transmit power signals to a subsequent passive device formed thereon. In some embodiments, the conductive pad 226 is formed of aluminum (Al). In some embodiments, the semiconductor chip 300 includes some other conductive pads used to transmit input/output (I/O), ground or power signals of the semiconductor chip 300 according to customer's designs. For example, the dielectric layers of the interconnection structure 220 may comprise the dielectric layers 216 and the first passivation layer 224. Also, the first passivation layer 224 belongs to the uppermost dielectric layer of the dielectric layers of the interconnection structure 220.

Please refer to FIG. 1 again, an integrated passive device (IPD) process is performed on the semiconductor chip 300 in accordance with some embodiments. The IPD process is used to fabricate a passive device integrated over the conductive pad. The passive device is surrounded by a passivation layer over an interconnection structure 220 of the semiconductor chip 300. A second passivation layer 228 is entirely formed covering the conductive pad 226 by a coating method. In some embodiments, the second passivation layer 228 is used for providing reliable insulation when the semiconductor chip 300 is subjected to various types of environmental stress. In some embodiments, the second passivation layer 228 includes photo-sensitive materials. Next, the second passivation layer 228 is subjected to a patterning process including a photolithography and a develop process to form openings 230 and 232 passing through the second passivation layer 228. The openings 230 and 232 are formed on the conductive pad 226, so that portions of a top surface 227 of the conductive pad 226 are respectively exposed from the openings 230 and 232.

Please refer to FIG. 1 again. The second passivation layer 228 is subjected to a curing process to solidify the second passivation layer 228 in accordance with some embodiments. After the curing process, the level of the second passivation layer 228 may drop as a result of shrinkage of the passivation layer.

Figure 2:
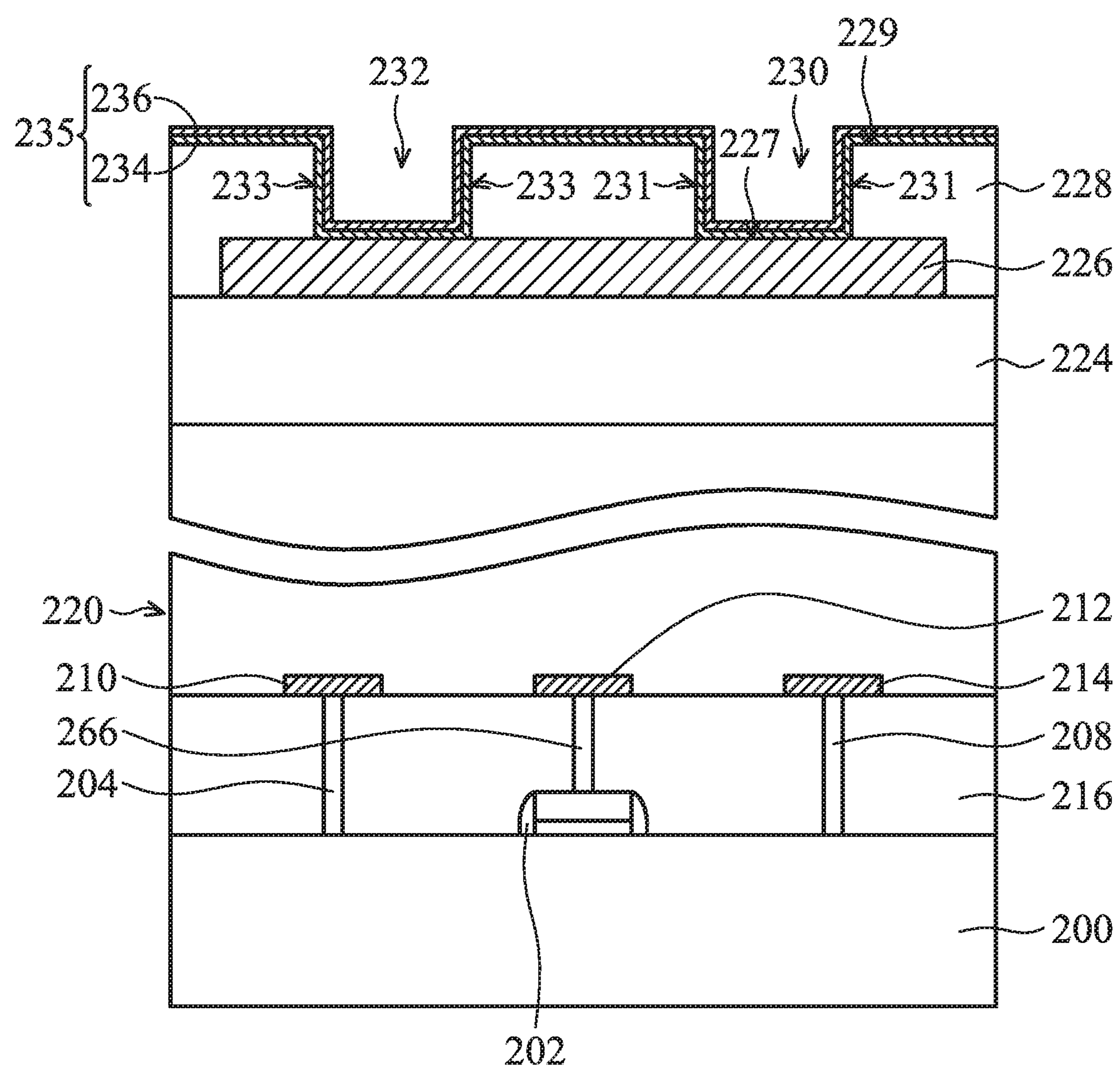
Figure 3:
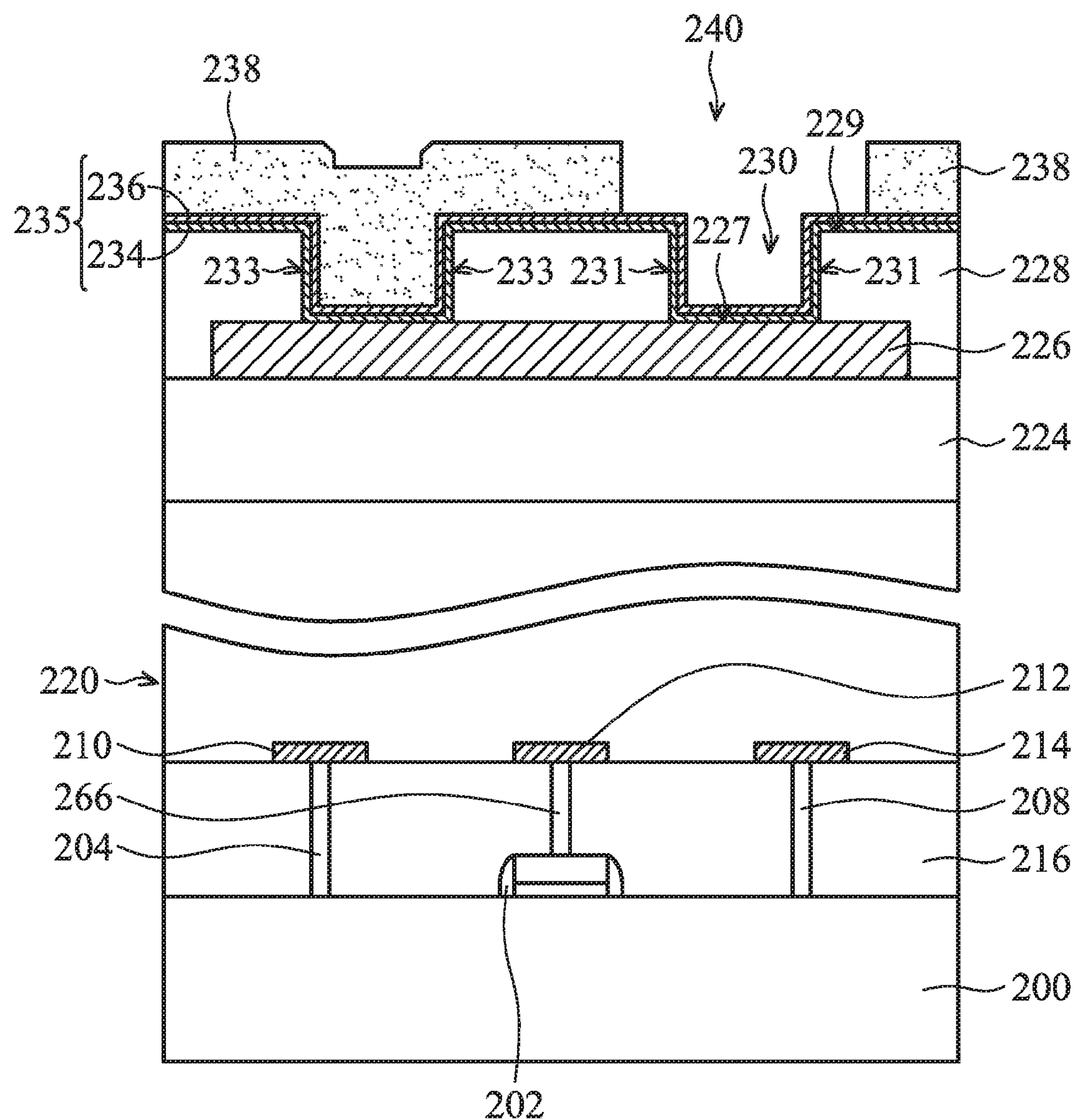
Figure 4:
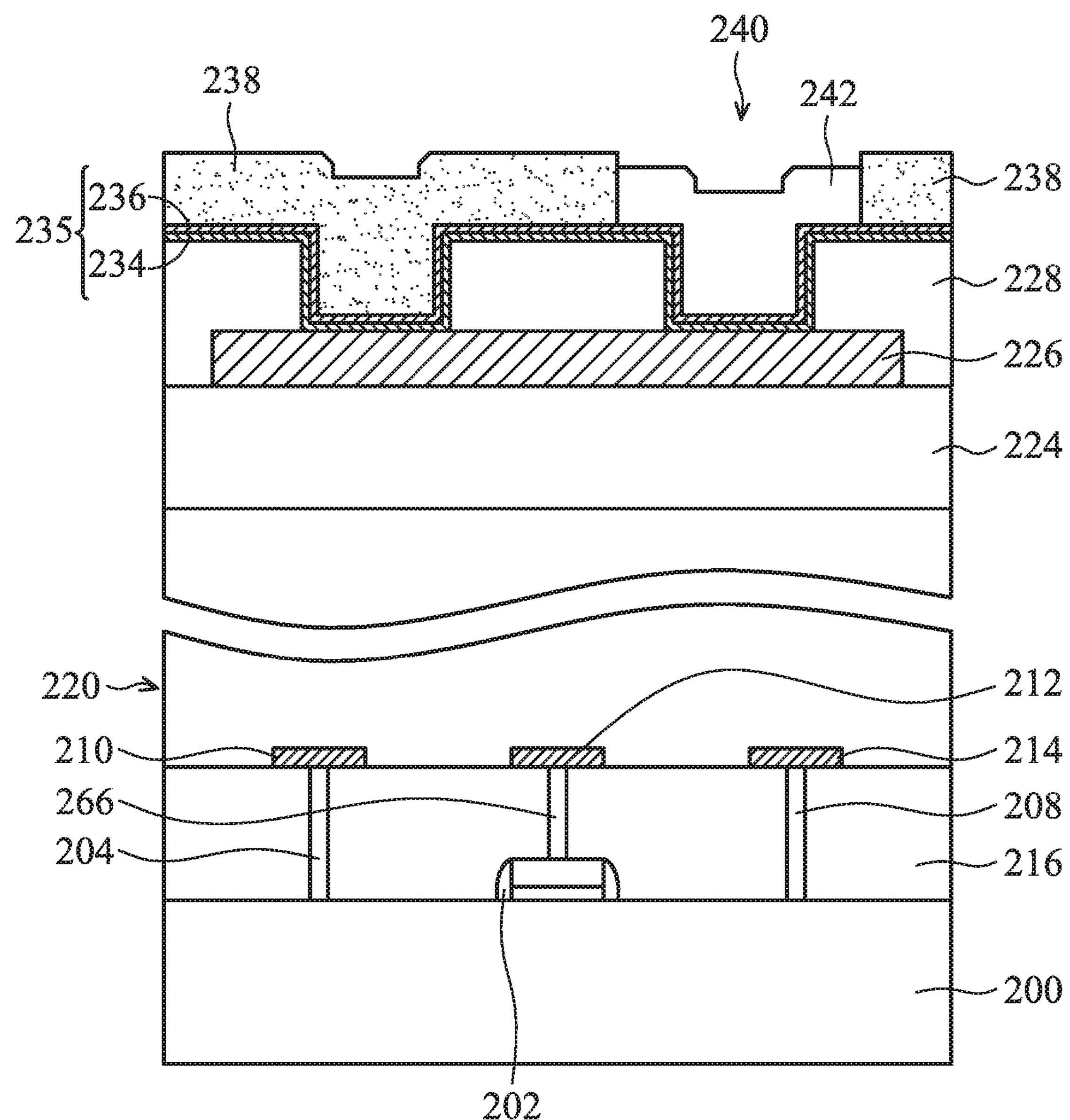
Figure 5:
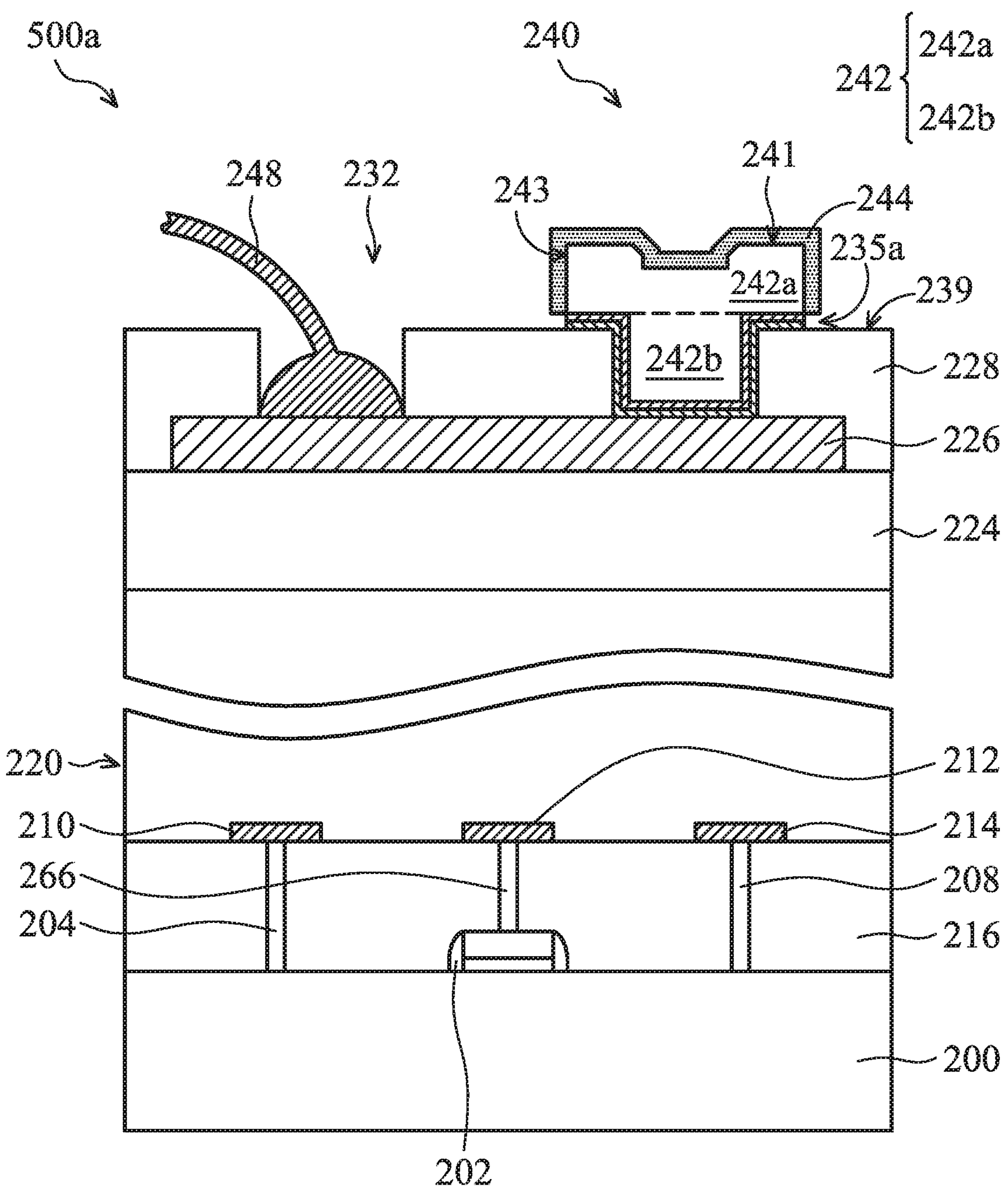

Please refer to FIG. 2. An under bump metallurgy (UBM) layer 235 is then blanket formed on the second passivation layer 228 by a deposition method in accordance with some embodiments. In some embodiments, the deposition method includes a physical vapor deposition (PVD), such as a sputtering or plating method. In some embodiments, the UBM layer 235 lines a sidewall 231 and a bottom surface of the openings 230 and 232. The bottom surfaces of the openings 230 and 232 are also portions of the top surface 227 of the second passivation layer 228. Also, the UBM layer 235 extends over a top surface 229 of the second passivation layer 228. In some embodiments, the UBM layer 235 includes a barrier layer 234, such as a copper (Ti) layer, and a seed layer 236, such as a copper (Cu) layer, on the barrier layer 234. In some other embodiments, the barrier layer 234 includes a titanium nitride (TiN) layer, a tantalum (Ta) layer, or a tantalum nitride (TaN) layer. In some other embodiments, the seed layer 236 includes a silver (Ag) layer, a gold (Au) layer, an aluminum (Al) layer, and combinations thereof FIGS. 3-5 show the formation of a passive device on the UBM layer 235. Next, refer to FIG. 3. A photoresist layer 238 is entirely formed on the UBM layer 235 in accordance with some embodiments. In some embodiments, the photoresist layer 238 includes a dry film photoresist or a liquid photoresist. Next, the photoresist layer 238 is patterned by a photolithography process comprising an exposure step and a development step to form an opening 240 over the conductive pad 226. In some embodiments, the opening 240 defines formation position of the subsequent passive device. In some embodiments as shown in FIG. 3, the opening 240 interconnects with the opening 230. Therefore, the opening 230 and a portion of the UBM layer 235, which is formed lining the sidewall 231 of the opening 230 and extending over a top surface 229 of the second passivation layer 228, are exposed to the opening 240.

Please refer to FIG. 4, a passive device 242 is then formed on a bottom surface of the opening 240 by an electroplating method in accordance with some embodiments. In some embodiments, the passive device 242 is formed filling the opening 240, covering the portion of the UBM layer 235, which is exposed to the opening 240 of the photoresist layer 238. Therefore, the passive device 242 is formed through the photoresist layer 238, electrically connected to the conductive pad 226 through the UBM layer 235. In some embodiments, the passive device 242 includes an inductor. In some other embodiments, the passive device 242 includes a balun device, a transformer, a routing or an antenna. In some other embodiments, the passive device 242 is formed of copper, so that deformation may be prevented during a subsequent solder re-flow process, which is used for a bump structure or wire bonding process. In some embodiments, the passive device 242 may have a thick thickness (defined by the photoresist layer 238) and have a robust structure, especially for forming an inductor.

Please refer to FIG. 5. The photoresist layer 238 is removed by a stripping process in accordance with some embodiments. In some other embodiments, the stripping process includes a wet etching process using a suitable etchant. Next, an anisotropic etching process is performed to remove the UBM layer 235 not covered by the passive device 242, thereby forming the UBM layer pattern **235*a* under the passive device 242**.

Next, please refer to FIG. 5 again, an organic solderability preservative (OSP) film 244 is formed covering a top surface 241 and a sidewall 243 of the passive device 242 by a coating process in accordance with some embodiments. In some embodiments, the OSP film 244 is disposed over the second passivation layer 228. It is noted that the OSP is used as a surface treatment for soldering due to its low cost, easy handling, low-temperature processing and environmentally friendly and metal-free (e.g. Ni-free) chemistry. In some embodiments, the OSP film 244 includes a composition comprising an alkyl cyclic alcohol, an azole derivative and, metal ions selected from the group consisting of zinc(II) ions, copper(II) ions, nickel(II) ions, cobalt(II) ions, iron(II) ions, and combinations thereof. In some other embodiments, the OSP film 244 includes a composition consisting essentially of: an alkyl cyclic alcohol present in a concentration of between about 0.5 and 100 mL/L, an azole derivative, zinc(II) ions, and water. In some other embodiments, the OSP film 244 includes a composition comprising a glycol-free monohydric alcohol having a boiling point of at least about 150° C., an azole derivative and, metal ions selected from the group consisting of zinc(II) ions, copper(II) ions, nickel(II) ions, cobalt(II) ions, iron(II) ions, and combinations thereof. In some other embodiments, the OSP film 244 includes a composition comprising a glycol-free monohydric alcohol having a boiling point of at least about 150° C., an azole derivative, metal ions selected from the group consisting of zinc(II) ions, copper(II) ions, nickel(II) ions, cobalt(II) ions, iron(II) ions, and combinations thereof, and a carboxylic acid selected from the group consisting of formic acid, acetic acid, and a combination thereof. In some other embodiments, the OSP film 244 includes a composition consisting essentially of: an alkyl cyclic alcohol, an azole derivative, zinc(II) ions, water, and a complexing agent selected from the group consisting of glycine, ethylenediaminetetraacetic acid (EDTA), ethylenediamine, and combinations thereof. In some other embodiments, the OSP film 244 includes a composition comprising an alkyl cyclic alcohol, an azole derivative, zinc(II) ions, water, and a carboxylic acid selected from the group consisting of formic acid, acetic acid, and a combination thereof.

In some embodiments, the OSP film 244 can selectively bonds to copper (Cu) and/or gold (Au) and provides an organometallic layer that protects the copper and/or gold during soldering. Therefore, the OSP film 244 is selectively formed on and in contact with the top surface 241 and the sidewall 243 of the passive device 242, which is formed of Cu, over the top surface 239 of the second passivation layer 228. That is to say, the OSP film 244 is only in contact with a first portion 242*a* of the passive device 242 over the second passivation layer 228. The UBM layer pattern 235*a* is in contact with a second portion 242*b* of the passive device 242 passing through the second passivation layer 228. Also, contact between the OSP film 244 and the second passivation layer 228 is avoided.

After performing the coating process as shown in FIG. 5, the passive device 242 of the semiconductor structure 300 with the OSP film 244 coated thereon is completely formed in accordance with some embodiments. The UBM layer pattern 235*a* and the OSP film 244 are conformably formed on the passive device 242. Also, the UBM layer pattern 235*a* and the OSP film 244 collectively wrap the passive device 242. The UBM layer pattern 235*a* is in contact with both the conductive pad 226 and the passive device 242. It is noted that the conductive pad 226 is only used to transmit power signals to the passive device 242 formed thereon, so that the conductive pad 226 partially, but not fully, overlaps with the passive device 242.

Next, please refer to FIG. 5 again, a bonding wire 248 is formed through the opening 232 and in contact with the conductive pad 226 by a Au or Cu wire bonding process in accordance with some embodiments. After the aforementioned processes, one exemplary embodiment of a semiconductor structure 500*a* is completely formed.

Figure 6:
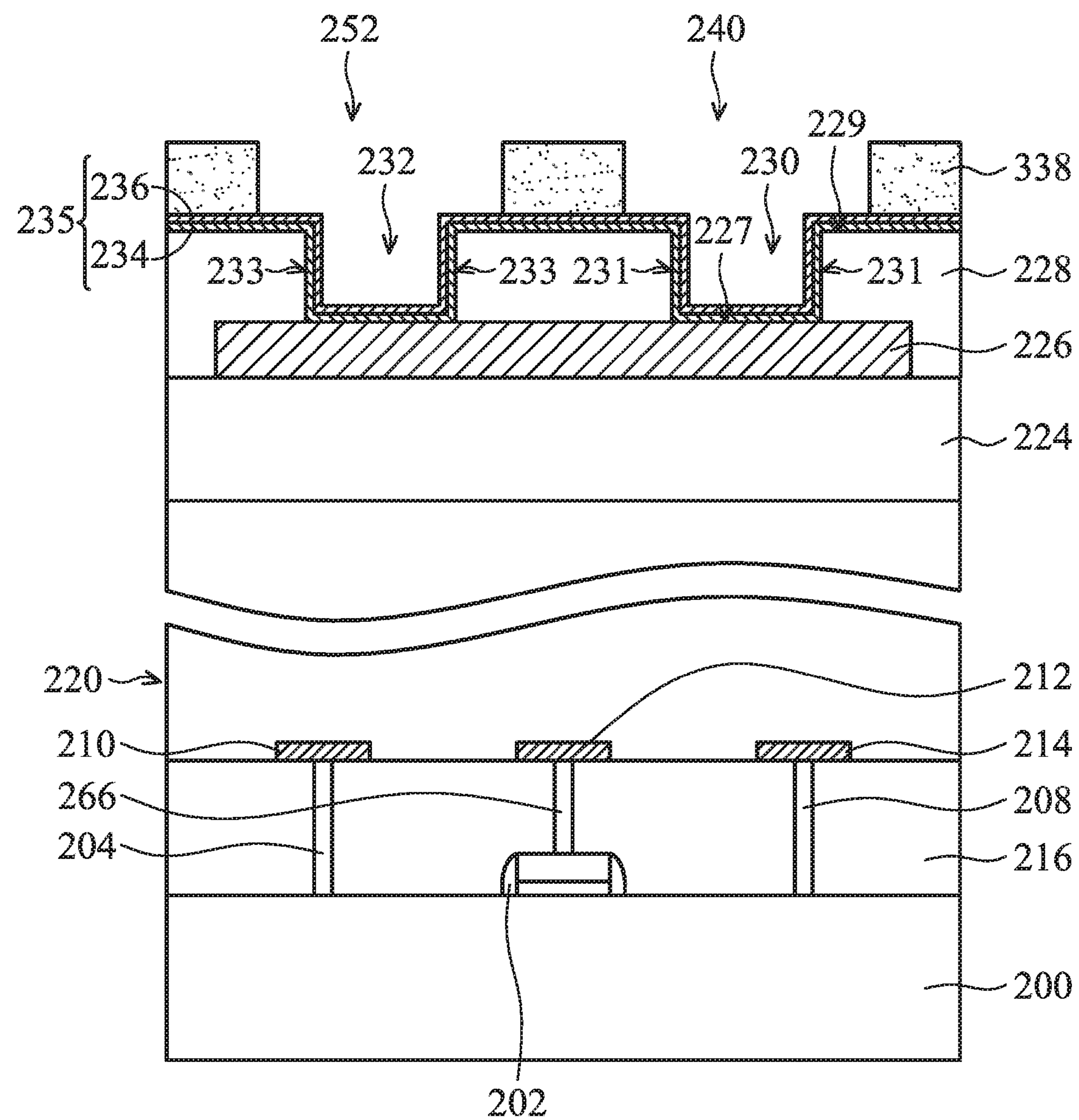
FIGS. 6-8 are cross-sectional views for fabricating another exemplary embodiment of a semiconductor structure of the invention.
Figure 7:
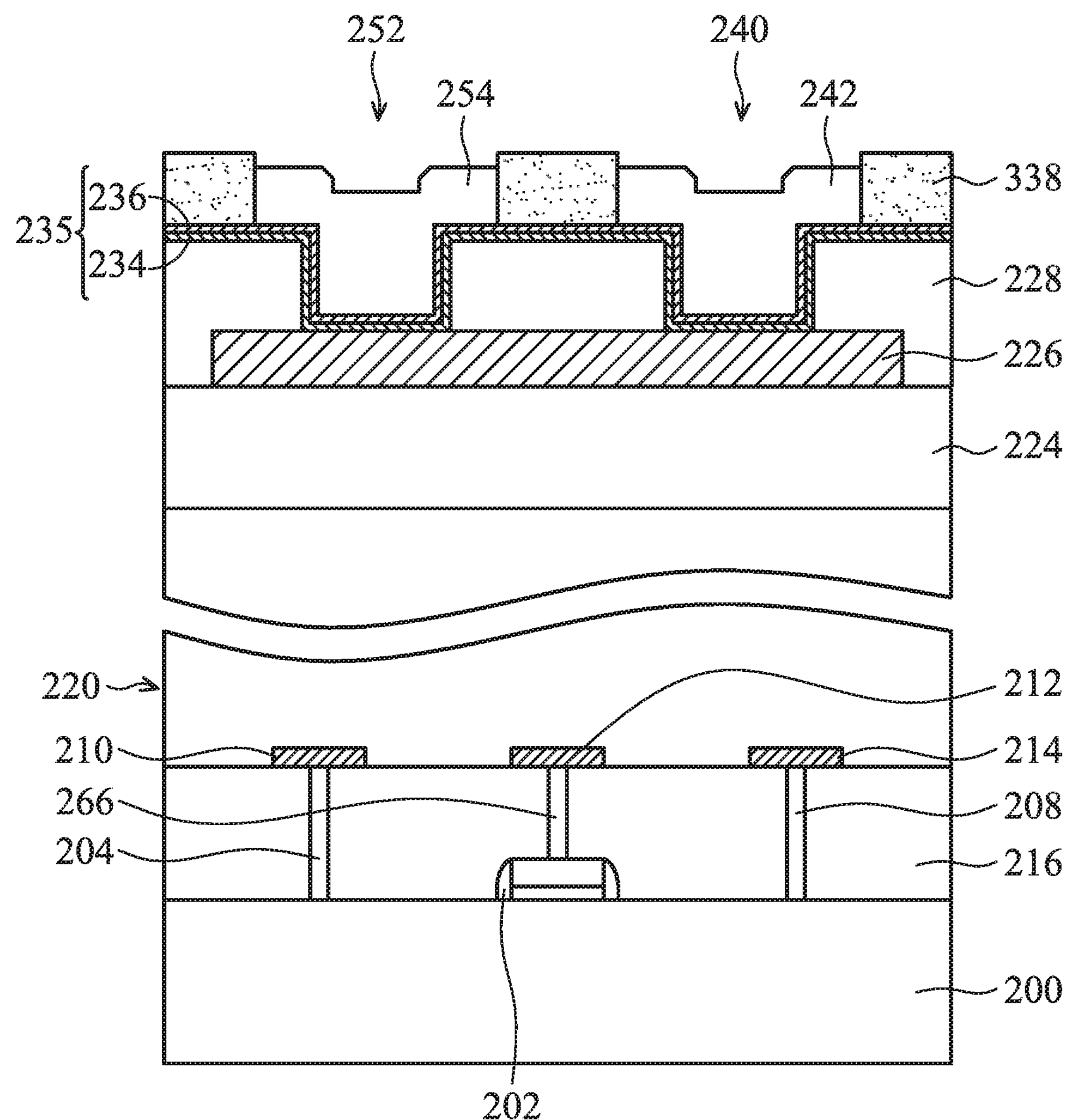
Figure 8:
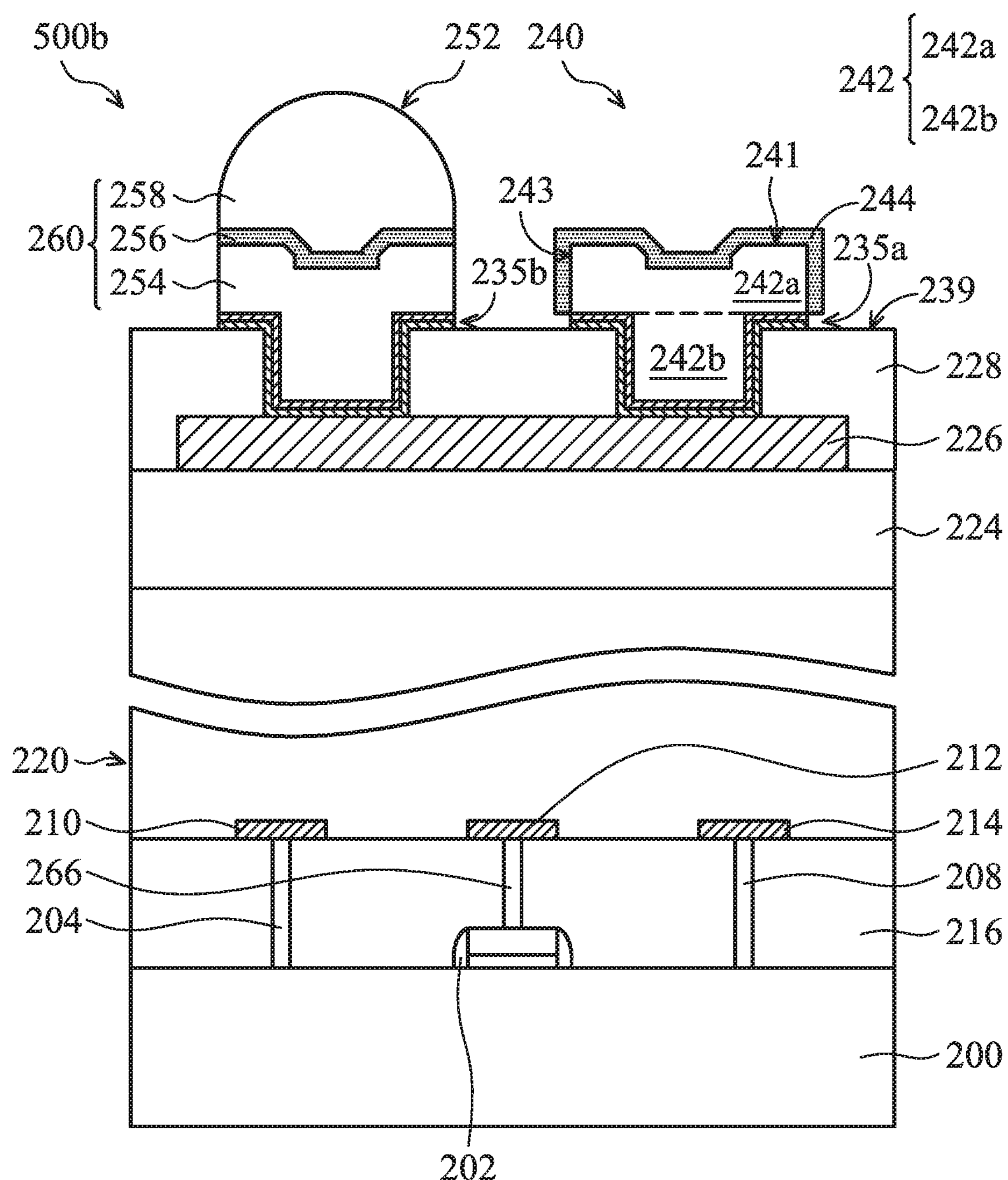

FIGS. 6-8 are cross-sectional views for fabricating another exemplary embodiment of a semiconductor structure 500*b* of the invention. In some embodiments, the semiconductor structure 500*b* includes a flip chip package. In some embodiments, the semiconductor structure 500*b* includes a passive device integrated with a conductive pillar, which is disposed between a metal pad and a conductive bump, of a bump structure. Elements of the embodiments hereinafter that are the same or similar as those previously described with reference to FIGS. 1-5, are not repeated for brevity FIGS. 6-8 also show formation of both a passive device and a conductive pillar on the UBM layer 235 of the semiconductor structure 500*b*. Next, refer to FIG. 6, a photoresist layer 338 is entirely formed on the UBM layer 235 in accordance with some embodiments. In some embodiments, the photoresist layer 338 includes a dry film photoresist or a liquid photoresist. Next, the photoresist layer 338 is patterned by a photolithography process comprising an exposure step and a development step to form openings 240 and 252 over the conductive pad 226. In some embodiments, the openings 240 and 252 define formation positions of the subsequent passive device and the conductive pillar. In some embodiments as shown in FIG. 6, the opening 240 interconnects with the opening 230 below to the opening 240. The opening 252 interconnects with the opening 232 below to the opening 252. In some embodiments, the opening 230 and a portion of the UBM layer 235, which is formed lining the sidewall 231 of the opening 230 and extending over a top surface 229 of the second passivation layer 228, are exposed to the opening 240. In some embodiments, the opening 232 and another portion of the UBM layer 235, which is formed lining the sidewall 233 of the opening 232 and extending over the top surface 229 of the second passivation layer 228, are exposed to the opening 252.

Please refer to FIG. 7. During the formation of the passive device 242, a conductive pillar 254 is formed on a bottom surface of the opening 252 by an electroplating method in accordance with some embodiments. In some embodiments, the passive device 242 is formed filling the opening 240 and covering the portion of the UBM layer 235, which is exposed to the opening 240 of the photoresist layer 238. In some embodiments, the conductive pillar 254 is formed filling the opening 252 and covering the portion of the UBM layer 235, which is exposed to the opening 252 of the photoresist layer 238. Therefore, the passive device 242 and the conductive pillar 254 are formed through the photoresist layer 238, electrically connected to the conductive pad 226 through the UBM layer 235. In some embodiments, the passive device 242 includes an inductor. In some other embodiments, the passive device 242 includes a balun device, a transformer, a routing or an antenna. In some embodiments, the passive device 242 may have a thick thickness (defined by the photoresist layer 238) and may have a robust structure, especially for forming an inductor. In some embodiments, the conductive pillar 254 is used as a solder joint for a subsequent conductive bump, which is used to transmit input/output (I/O), ground or power signals of the semiconductor chip 300, formed thereon. Therefore, the conductive pillar 254 may help to increase the mechanical strength of the bump structure. In some embodiments, the conductive pillar 254 may be formed of copper, so that deformation may be prevented during a subsequent solder re-flow process.

Please refer to FIG. 8, the photoresist layer 238 is then removed by a stripping process in accordance with some embodiments. In some other embodiments, the stripping process includes a wet etching process using a suitable etchant. Next, an anisotropic etching process is performed to remove the UBM layer 235 not covered by the passive device 242 and the conductive pillar 254. After performing the anisotropic etching process, a UBM layer pattern 235*a* is formed under the passive device 242, and a UBM layer pattern 235*b* is formed under conductive pillar 254. The UBM layer pattern 235*a* is separated from the UBM layer pattern 235*b*.

Next, please refer to FIG. 8 again, another photoresist pattern (not shown) is formed covering the conductive pillar 254. The passive device 242 is exposed to the photoresist pattern. In some embodiments, the photoresist pattern includes a dry film photoresist or a liquid photoresist.

Next, please refer to FIG. 8 again, an organic solderability preservative (OSP) film 244 is formed covering a top surface 241 and a sidewall 243 of the passive device 242 by a coating process in accordance with some embodiments. In some embodiments, the OSP film 244 is disposed over the second passivation layer 228. It is noted that the OSP is used as a surface treatment for soldering due to its low cost, easy handling, low-temperature processing and environmentally friendly and metal-free (e.g. Ni-free) chemistry. In some embodiments, the OSP film 244 includes a composition comprising an alkyl cyclic alcohol, an azole derivative and, metal ions selected from the group consisting of zinc(II) ions, copper(II) ions, nickel(II) ions, cobalt(II) ions, iron(II) ions, and combinations thereof. In some other embodiments, the OSP film 244 includes a composition consisting essentially of: an alkyl cyclic alcohol present in a concentration of between about 0.5 and 100 mL/L, an azole derivative, zinc(II) ions, and water. In some other embodiments, the OSP film 244 includes a composition comprising a glycol-free monohydric alcohol having a boiling point of at least about 150° C., an azole derivative and, metal ions selected from the group consisting of zinc(II) ions, copper(II) ions, nickel(II) ions, cobalt(II) ions, iron(II) ions, and combinations thereof. In some other embodiments, the OSP film 244 includes a composition comprising a glycol-free monohydric alcohol having a boiling point of at least about 150° C., an azole derivative, metal ions selected from the group consisting of zinc(II) ions, copper(II) ions, nickel(II) ions, cobalt(II) ions, iron(II) ions, and combinations thereof, and a carboxylic acid selected from the group consisting of formic acid, acetic acid, and a combination thereof. In some other embodiments, the OSP film 244 includes a composition consisting essentially of: an alkyl cyclic alcohol, an azole derivative, zinc(II) ions, water, and a complexing agent selected from the group consisting of glycine, ethylenediaminetetraacetic acid (EDTA), ethylenediamine, and combinations thereof. In some other embodiments, the OSP film 244 includes a composition comprising an alkyl cyclic alcohol, an azole derivative, zinc(II) ions, water, and a carboxylic acid selected from the group consisting of formic acid, acetic acid, and a combination thereof.

In some embodiments, the OSP film 244 can selectively bonds to copper (Cu) and/or gold (Au) and provides an organometallic layer that protects the copper and/or gold during soldering. Therefore, the OSP film 244 is selectively formed on and in contact with the top surface 241 and the sidewall 243 of the passive device 242, which is formed of Cu, over the top surface 239 of the second passivation layer 228. That is to say, the OSP film 244 is only in contact with a first portion **242*a* of the passive device 242 over the second passivation layer 228. The UBM layer pattern 235*a* is in contact with a second portion 242*b* of the passive device 242 passing through the second passivation layer 228. Also, contact between the OSP film 244 and the second passivation layer 228** is avoided.

Next, please refer to FIG. 8 again, the photoresist pattern (not shown) covering the conductive pillar 254 is removed by a stripping process in accordance with some embodiments. In some other embodiments, the stripping process includes a wet etching process using a suitable etchant.

Next, please refer to FIG. 8 again, yet another photoresist pattern (not shown) is formed covering the passive device 242 and the OSP film 244. The conductive pillar 254 is exposed to the photoresist pattern. In some embodiments, the photoresist pattern includes a dry film photoresist or a liquid photoresist.

Next, please refer to FIG. 8 again, a conductive buffer layer 256 is formed on the conductive pillar 254 by an electroplating method. In one embodiment, the conductive buffer layer 256 is an optional element serving as a seed layer, an adhesion layer and a barrier layer for a subsequent conductive bump formed thereon. In one embodiment, the conductive buffer layer 256 may comprise Ni.

Next, a solder is formed on the conductive buffer layer 256 by electroplating with a patterned photoresist layer or by a screen printing process. Next, the patterned photoresist layer is removed and a solder re-flow process is performed to form a conductive bump 258 on the conductive pillar 254. In some other embodiments, the conductive pillar 254, the overlying conductive bump 258 and the conductive buffer layer 256 (optional) therebetween collectively form a bump structure 260.

Next, please refer to FIG. 8 again, the photoresist pattern (not shown) covering the passive device 242 and the OSP film 244 is removed by a stripping process in accordance with some embodiments. In some other embodiments, the stripping process includes a wet etching process using a suitable etchant.

In some embodiments, the process sequence of the OSP film 244 and the bump structure 260 can be switched. For example, the photoresist pattern can be formed covering the passive device 242 for the formation of the bump structure 260. The photoresist pattern covering the passive device 242 is then removed. Another photoresist pattern is then formed covering the bump structure 260 for the formation of the OSP film 244 on the passive device 242.

After the aforementioned processes, another exemplary embodiment of a semiconductor structure **500*b* having the passive device 242 with the OSP film 244 coated thereon and the bump structure 260 is completely formed in accordance with some embodiments. The UBM layer pattern 235*a* and the OSP film 244 are conformably formed on the passive device 242. Also, the UBM layer pattern 235*a* and the OSP film 244 collectively wrap the passive device 242. The UBM layer pattern 235*a* is in contact with both the conductive pad 226 and the passive device 242. It is noted that the conductive pad 226 and the bump structure 260 are used to transmit power signals to the passive device 242 formed on the conductive pad 226, so that the conductive pad 226 partially, but not fully overlaps with the passive device 242 and the bump structure 260**.

Additionally, the semiconductor structure **500*b* can bond to a printed circuit board (PCB) (not shown). In some embodiments, an underfill material (not shown) may optionally fill space between the semiconductor structure 500*b* and the printed circuit board (PCB). It is noted that the conductive bump 260 of the semiconductor structure 500*b* bonds to a metal pad of the printed circuit board (PCB) disposed over the conductive bump 260 and the passive device 242 of the semiconductor structure 500*b***.

Exemplary embodiments of the semiconductor structures **500*a* and 500*b* have the following advantages. The semiconductor structures 500*a* and 500*b* include a passive device integrated over the conductive pad by an integrated passive device (IPD) process. The passive device 242 (FIG. 5 or FIG. 8) of each of the semiconductor structures 500*a* and 500*b*** is protected by an organic solderability preservative (OSP) film. The OSP film is used to replace a Ni/Au protection layer with simple processes. If the passive device is an inductor or balun device, the OSP film can prevent the passive device from the skin effect occurring during the operation of the passive device. The passive device, for example, an inductor or balun device, covered by the OSP film has reduced resistance and a high quality factor (Q factor). The passive device may be formed at the same level with the bonding wire. Alternatively, the passive device may be formed at the same level with the conductive pillar, which is disposed between a metal pad and a conductive bump of the bump structure, without additional metal layers. The passive device may have a thickness that is much thicker than a conventional passive device disposed in the interconnection structure. If the passive device is an inductor or a balun device, the passive device has a reduced resistance and a high quality factor (Q factor). Additionally, a layer level of the passive device may have a wider design rule because an area of the passive device is not limited by arrangements of the metal layers and vias of the interconnection structure.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:

a substrate;

a first passivation layer disposed on the substrate;

a conductive pad disposed on the first passivation layer;

a second passivation layer disposed on the first passivation layer;

a conductive structure disposed on the conductive pad;

a passive device disposed on the conductive pad, the passive device having a first portion located above the second passivation layer and a second portion passing through the second passivation layer, wherein the passive device comprises a balun device, an inductor, a transformer, or an antenna;

a solderability preservative film covering a top surface and a sidewall of the first portion of the passive device; and an under bump metallurgy (UBM) layer covering the second portion of the passive device and a portion of the conductive structure, wherein the UBM layer and the solderability preservative film entirely wrap the passive device, wherein the under bump metallurgy layer extends over a top surface of the second passivation layer such that the solderability preservative film does not contact the second passivation layer.

2. The semiconductor device as claimed in claim 1, wherein the second passivation layer has a first opening passing therethrough, wherein the conductive pad is exposed from the first opening.

3. The semiconductor device as claimed in claim 1, wherein the passive device is disposed on the under bump metallurgy layer, electrically connected to the conductive pad through the under bump metallurgy layer.

4. The semiconductor structure as claimed in claim 1, wherein the solderability preservative film is disposed over the second passivation layer.

5. The semiconductor structure as claimed in claim 1, wherein the solderability preservative film is only in contact with the first portion of the passive device over the second passivation layer, wherein the under bump metallurgy layer is in contact with the second portion of the passive device passing through the second passivation layer.

6. The semiconductor structure as claimed in claim 2, wherein the second passivation layer has a second opening passing therethrough, wherein the conductive pad is exposed from the second opening.

7. The semiconductor structure as claimed in claim 6, wherein the conductive structure is disposed in the second opening, electrically connected to the conductive pad.

8. The semiconductor structure as claimed in claim 1, wherein the conductive structure further comprising a conductive pillar, a buffer layer and a solder bump.

9. A semiconductor structure, comprising:

a substrate;

a first passivation layer disposed on the substrate;

a conductive pad disposed on the first passivation layer;

a second passivation layer disposed on the first passivation layer;

a passive device disposed on the conductive pad, the passive device having a first portion located above the second passivation layer and a second portion passing through the second passivation layer, wherein the passive device comprises a balun device, an inductor, a transformer, or an antenna;

a solderability preservative film covering a top surface and a sidewall of the first portion of the passive device; and an under bump metallurgy (UBM) layer covering the second portion of the passive device and a portion of the conductive structure, wherein the UBM layer and the solderability preservative film wrap the passive device, wherein the under bump metallurgy layer does not contact the second passivation layer.

10. The semiconductor device as claimed in claim 9, wherein the second passivation layer has a first opening passing therethrough, wherein the conductive pad is exposed from the first opening.

11. The semiconductor device as claimed in claim 9, wherein the passive device is disposed on the under bump metallurgy layer, electrically connected to the conductive pad through the under bump metallurgy layer.

12. The semiconductor structure as claimed in claim 9, wherein the solderability preservative film is disposed over the second passivation layer.

13. The semiconductor structure as claimed in claim 9, wherein the solderability preservative film is only in contact with the first portion of the passive device over the second passivation layer, wherein the under bump metallurgy layer is in contact with the second portion of the passive device passing through the second passivation layer.

14. The semiconductor structure as claimed in claim 10, wherein the second passivation layer has a second opening passing therethrough, wherein the conductive pad is exposed from the second opening.

15. The semiconductor structure as claimed in claim 14, wherein a conductive structure is disposed in the second opening, electrically connected to the conductive pad.

16. The semiconductor structure as claimed in claim 15, wherein the conductive structure further comprising a conductive pillar, a buffer layer and a solder bump.

* * * * *